United States Patent [19]

Spencer

[11] Patent Number: 5,449,862

[45] Date of Patent: Sep. 12, 1995

[54] PLANAR CABLE ARRAY

[75] Inventor: Mark S. Spencer, Phoenix, Ariz.

[73] Assignee: W. L. Gore & Associates, Inc., Newark, Del.

[21] Appl. No.: 111,673

[22] Filed: Aug. 25, 1993

Related U.S. Application Data

[63] Continuation-in-part of Ser. No. 65,344, May 20, 1993.

[51] Int. Cl.$^6$ .............................................. H01B 7/00
[52] U.S. Cl. .............................. 174/117 F; 174/268; 174/117 R
[58] Field of Search ......... 174/117 P, 117 FF, 117 R, 174/268

[56] References Cited

U.S. PATENT DOCUMENTS

| | | |
|---|---|---|
| 3,547,718 | 12/1970 | Gordon .......................... 174/117 F |
| 3,704,164 | 11/1972 | Travis ............................ 174/117 F |
| 4,467,138 | 8/1984 | Brorein .......................... 174/117 F |
| 4,639,693 | 1/1987 | Suzuki ............................ 174/117 F |
| 4,716,259 | 12/1987 | Tokura et al. . | |

FOREIGN PATENT DOCUMENTS

| | | |
|---|---|---|
| 2557385 | 6/1985 | France . |
| 7809466 | 7/1978 | Germany . |
| 0246605 | 2/1990 | Japan ............................. 174/117 F |
| 0433211 | 2/1992 | Japan ............................. 174/117 F |
| 372580 | 5/1973 | U.S.S.R. ......................... 174/117 F |
| 1415236 | 8/1988 | U.S.S.R. ......................... 174/117 F |

OTHER PUBLICATIONS

IBM Tech. Disclosure Bulletin, vol. 24, No. 9—Feb. 1982.

*Primary Examiner*—Leo P. Picard
*Assistant Examiner*—Stephen T. Ryan
*Attorney, Agent, or Firm*—Gary A. Samuels

[57] ABSTRACT

This invention provides a high-density planar contact array capable of interconnecting various electronic devices using a pad to pad approach or pad to pin, and which is capable of accommodating non-coplanarity in the Z axis of printed circuit boards but which still maintains good electrical contact.

The array comprises a flat, flexible insulative substrate sheet that has a plurality of parallel conductive lines or an array of circles or polygons of which each has had insulative material surrounding or on at least two sides of the conductive lines or polygons removed in the Z axis. The insulative material is removed in such a way as to create a generally trapezoid shape having a greater length side opposite the conductor when viewed through a cross-section of the X or Y axis. This trapezoid shape allows free Z axis motion while limiting X and Y axis motion.

2 Claims, 4 Drawing Sheets

Z DIRECTION

PLANAR CABLE ARRAY

CROSS-REFERENCE TO RELATED APPLICATION

This application is a continuation-in-part of application Ser. No. 08/065,344 filed May 20, 1993.

FIELD OF THE INVENTION

This invention relates to a high-density planar electrical contact array, which is used for electrical signal transmission between a planar circuit, such as a printed circuit board, and other electrical devices such as a second printed circuit board.

BACKGROUND OF THE INVENTION

It is often necessary to provide a means for transmitting electrical signals from one planar circuit, such as a printed circuit board to another circuit board or integrated circuit lead frame, multi-chip module, tape automated bonding devices or other device that utilizes electrical contacts. Various connector and contact devices have been used in the past to accomplish this. One existing method shown in FIGS. 9a and 9b utilizes individual formed metal contacts 40 imbedded in an insulative housing 41 that separates each contact from adjacent contacts with each contact being directly connected to the other device or through a wire or flexible circuit board to another device. Another method shown in FIGS 10a and 10b utilizes individual wires 42 inserted into a comb-like insulative housing 43 which separates each wire from adjacent wires thus forming individual contacts out of the wire itself. The wires are insulated at 44. Yet another method utilizes a single or multiplicity of parallel lines on a printed circuit 45 shown in FIG. 1, usually a flexible printed circuit, and uses lines 46 as contacts by mating them directly to a device 47 and applying pressure via an elastomeric material 48 which is held by housing 49, and/or clamping device. However, this last method does not allow good Z axis movement of an individual contact without affecting adjacent contacts unless the insulative planar substrate material is extremely thin, between 0.001 inch and 0.003 inch thick, or each conductor must have insulative layer removed from between each conductor. The first method involves a very thin substrate and limits the use of multiple layered and controlled impedance constructions and must usually require some other means of mechanical support such as an elastomeric material behind the conductors and substrate. The second method, i.e., removing the insulative substrate material allows lateral or X or Y axis movement which can result in misalignment to the device being mated to or the shorting of adjacent conductor pads.

SUMMARY OF THE INVENTION

This invention provides a high-density planar contact array capable of interconnecting various electronic devices using a pad to pad approach or pad to pin, and which is capable of accommodating non-coplanarity in the Z axis of printed circuit boards but which still maintains good electrical contact.

The array comprises a flat, flexible insulative substrate sheet that has a plurality of parallel conductive lines or an array of circles or polygons of which each has had insulative material surrounding or on at least two sides of the conductive lines or polygons removed in the Z axis. The insulative material is preferably removed in such a way as to create a generally trapezoid shape having a greater length side opposite the conductor when viewed through a cross-section of the X or Y axis. This trapezoid shape allows free Z axis motion while limiting X and Y axis motion. Various materials and thicknesses of conductor and substrate materials may be used as well as various supportive material layers to best fit the electrical and mechanical requirements in an application.

By planar contact array is meant any one of several planar devices such as a printed circuit board, flexible printed circuit board, ribbon cable, or flat conductor cables.

BRIEF DESCRIPTION OF DRAWINGS

FIGS. 7 and 8 are like those of FIGS. 1 and 2 except that the insulation in the window area forms a trapezoid.

DETAILED DESCRIPTION OF THE INVENTION

Figure 1:
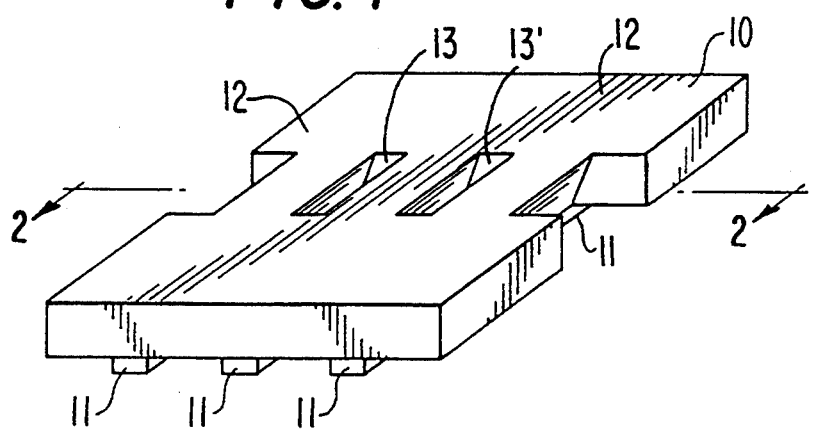
FIG. 1 is a perspective view of a planar contact array of the invention.
Figure 2:
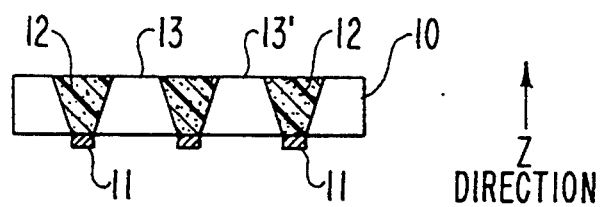
FIG. 2 is a cutaway view of the array of FIG. 1 taken along lines 2—2 of FIG. 1 and show the trapezoidal shapes remaining after insulative substrate material is cutaway to form windows through the substrate.
Figure 3:
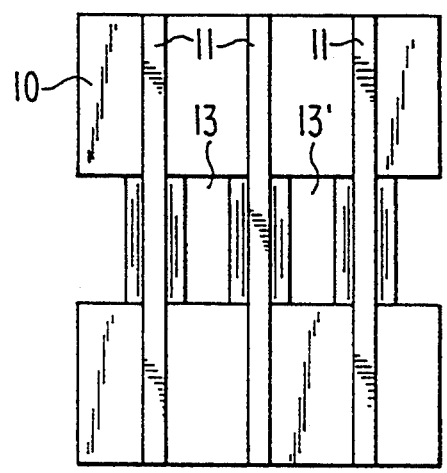
FIG. 3 is a view from the bottom of a section of the array of FIG. 1.

Referring to FIGS. 1 and 2, a planar strip of insulation 10 having a plurality of parallel conductors 11 on one surface of the flexible strip is depicted. In at least one section of the strip, adjacent parallel conductors are exposed on one side of the strip (shown in FIGS. 2 and 3); and the insulation on the opposite side forms a quadrilateral trapezoid cross-section 12 with the conductor at the narrowest length of the trapezoid. The adjacent bases of the longer parallel length of the trapezoid, do not abut, and form an opening at 13 and 13[1] through the strip of insulation.

It is a common deficiency in many printed circuit boards that the substrate board is not completely planar, i.e., it contains "valleys" and "hills" over its surface. Thus, when a ribbon cable interconnect is employed, the variation in surface planarity of the board causes uneven contact between the traces of the board and the conductors of the cable array. As explained above, removal of insulation between conductors in selected portions of the cable enables the conductor to ride freely and interface with the uneven surface of the substrate board. The insulation is conveniently removed by burning it away with a laser beam.

Figure 7:
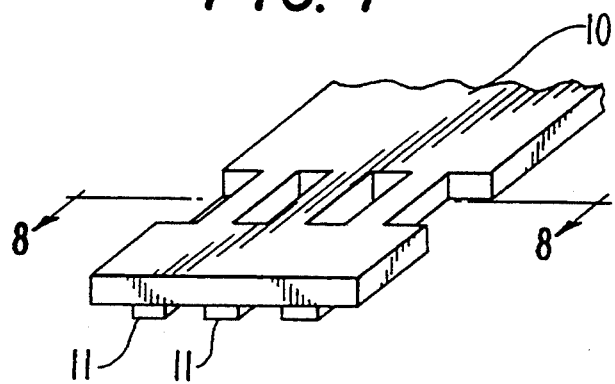
FIG. 7 is a perspective view of a planar contact array of a strip of insulation 10 with parallel conductors 11 on the bottom surface.
Figure 8:
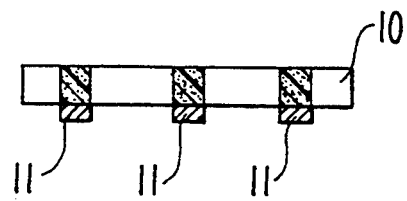
FIG. 8 is a view taken along line 8—8 of FIG. 7 and shows the rectangular shape of the insulation in the window area.
Figure 9A:
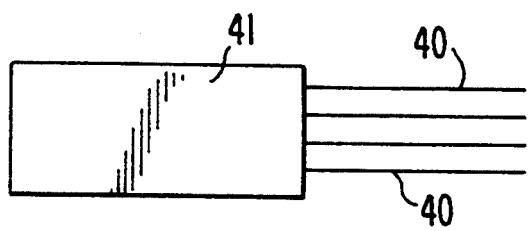
FIGS. 9a and 9b depict top and side views respectively of individual metal contacts embedded in an insulative housing.
Figure 10A:
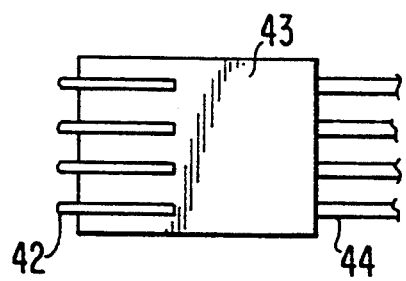
FIGS. 10a and 10b depict top and side views respectively of conductive wires wrapped on a comb-like insulative housing.
Figure 9B:
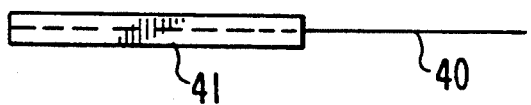
Figure 10B:
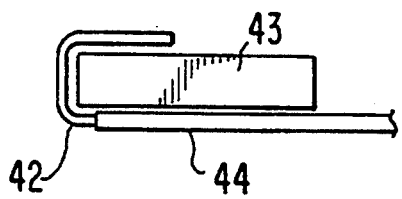
Figure 11:
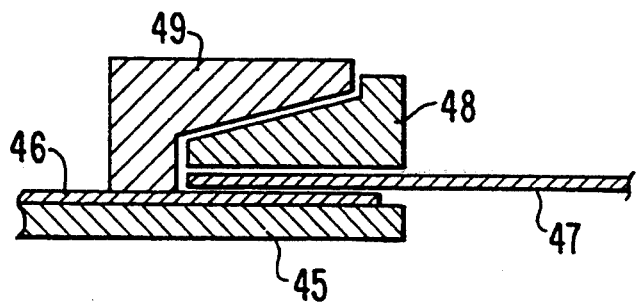
FIG. 11 depicts a PCB viewed from the side mated with a ribbon cable and held in place by a pressure webs.

FIGS. 1 and 2 depict removal of insulation so as to result in a trapezoidal configuration. FIGS. 7 and 8 depict removal so as to result in a rectangular configuration. The trapezoidal configuration provides better stability in the X and Y direction.

Figure 4:
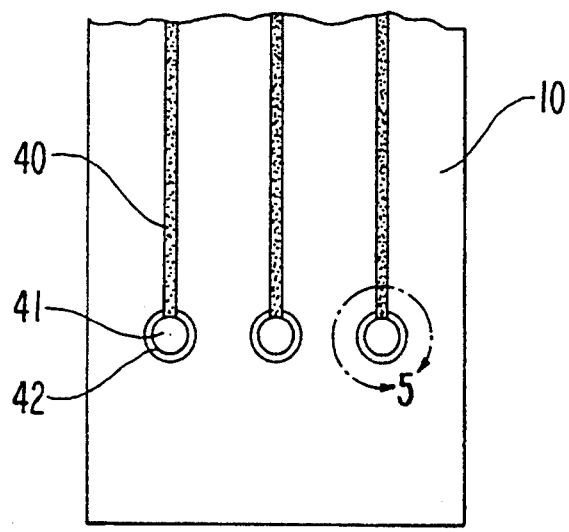
FIG. 4 shows the top view of an array of the invention in which electrical circuits culminate in floating electrical contact pads.

FIG. 4 depicts a cable array in which the conductors 40 end in pad 41 that floats semi-freely in through-hole 42.

Figure 5:
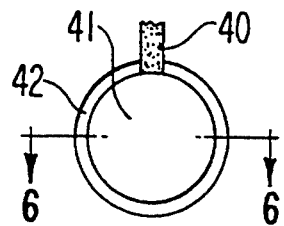
FIG. 5 is an enlargement of the circled portion of FIG. 4.

FIG. 5 is an enlargement of the circular area shown in FIG. 4.

Figure 6:
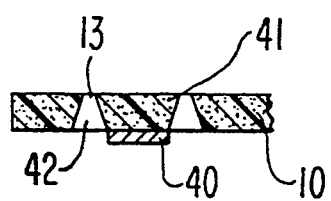
FIG. 6 is a side view taken along lines 6—6 of FIG. 5.

FIG. 6 is a cutaway view along lines 6—6 of FIG. 5 and shows the rectangular configuration of one embodiment.

Very high density conductor transmission cables can be used as the array. For example, very fine lines of conductive material of 0.001 to 0.005 inches wide and 0.0005 to 0.0015 inches thick can be used, and can be spaced parallel apart at a spacing of 0.002 inches between centers. The cable can be as thin as 0.001 inches.

One application for the cable array is in a connector assembly for connecting one printed circuit board to another printed circuit board having one end of the cable array bonded by ultrasonic welding, solder or conductive glue to make electrical contact between at least one conductive trace of the cable array and at least one conductive trace of the first printed circuit board (mother board) while the opposite end of the cable array contacts and is affixed to another printed circuit board.

I claim:

1. A planar strip of insulation having a plurality of parallel conductors on one surface of the flexible strip in which, in at least one section of the strip, adjacent parallel conductors are exposed on one side of the strip; and in which the insulation on the opposite side forms a quadrilateral trapezoid cross-section with the conductor at the narrowest length of the trapezoid and in which the adjacent bases of the longer parallel length of the trapezoid do not abut, so as to form an opening through the strip of insulation.

2. A planar strip of insulation having a plurality of parallel conductors on one surface of the flexible strip in which, in at least one section of the strip, adjacent parallel conductors are exposed on one side of the strip; and in which the insulation on the opposite side forms a rectangular cross-section with the conductor at the narrowest length of the rectangle and in which the adjacent sides of the longer parallel length of the rectangle do not abut, so as to form an opening through the strip of insulation.

* * * * *